(12) United States Patent
Nogami et al.

(10) Patent No.: US 6,809,029 B2
(45) Date of Patent: Oct. 26, 2004

(54) SEMICONDUCTOR PRODUCTION DEVICE AND PRODUCTION METHOD FOR SEMICONDUCTOR DEVICE

(75) Inventors: Takeshi Nogami, Kanagawa (JP); Naoki Komai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/149,858
(22) PCT Filed: Oct. 12, 2001
(86) PCT No.: PCT/JP01/08981
 § 371 (c)(1),
 (2), (4) Date: Oct. 7, 2002
(87) PCT Pub. No.: WO02/31231
 PCT Pub. Date: Apr. 18, 2002

(65) Prior Publication Data
 US 2003/0113996 A1 Jun. 19, 2003

(30) Foreign Application Priority Data
 Oct. 13, 2000 (JP) ........................ 2000-312834

(51) Int. Cl.⁷ .......................................... H01L 21/4763
(52) U.S. Cl. .................... 438/638; 438/618; 438/622; 438/641; 438/677; 438/678; 438/687
(58) Field of Search ................. 438/618, 622, 438/641, 677, 687

(56) References Cited

U.S. PATENT DOCUMENTS 6,486,055 B1 * 11/2002 Jung et al. ................. 438/618

6,602,787 B2 * 8/2003 Komai et al. ............... 438/687

FOREIGN PATENT DOCUMENTS

JP 51 1326 1/1976
JP 2 217498 8/1990

* cited by examiner

*Primary Examiner*—David Nelms
*Assistant Examiner*—Renee R. Berry
(74) *Attorney, Agent, or Firm*—Sonnenschein, Nath & Rosenthal LLP

(57) ABSTRACT

The present invention provides a semiconductor manufacturing apparatus capable of shortening TAT by completing a plurality of processes including plating, annealing, and CMP-in-twice or the like in copper wiring process in a single manufacturing apparatus, and is also capable of suppressing costs for consumable materials by replacing the CMP step with other step. The apparatus of the present invention comprises an electrolytic plating chamber (11) for performing electrolytic plating of a substrate (91), an electrolytic polishing chamber (21) for performing electrolytic polishing of the substrate, and a conveying chamber (81) having installed therein a conveying instrument (83) responsible for loading/unloading of the substrate to or from the electrolytic plating chamber, and to or from he electrolytic polishing chamber, and is connected respectively to the electrolytic plating chamber and the electrolytic polishing chamber. The conveying chamber may further have connected thereto an electroless plating chamber, an annealing chamber, a liquid treatment chamber or the like.

11 Claims, 7 Drawing Sheets

1: FIRST SEMICONDUCTOR MANUFACTURING APPARATUS
11: ELECTROLYTIC PLATING CHAMBER
21: ELECTROLYTIC POLISHING CHAMBER
81: CONVEYING CHAMBER
83: CONVEYING INSTRUMENT
91: SUBSTRATE

SEMICONDUCTOR PRODUCTION DEVICE AND PRODUCTION METHOD FOR SEMICONDUCTOR DEVICE

BACKGROUND OF THE INVENTION

The present invention relates to a semiconductor manufacturing device and a method for manufacturing semiconductor devices, and more specifically to those conducting two process steps of electrolytic copper plating and electrolytic polishing, or four process steps of electrolytic copper plating, annealing, electrolytic polishing and selective CoWP electroless plating.

BACKGROUND ART

Copper wiring is becoming to more highly be appreciated for use in micro-devices in which circuit delay due to parasitic resistance and parasitic capacitance of the wiring is predominant, since it can achieve lower resistivity, lower-capacitance and higher reliability as compared with those achieved by aluminum wiring. Damascene processes are widely accepted as the most general method for forming copper wiring. Of the damascene processes, dual-damascene process is most widely accepted in view of production costs. The copper wiring process has thus been expected to be reduced in cost as compared with that in the conventional aluminum wiring process through employment of the dual-damascene process.

In a typical dual-damascene process, a barrier layer is formed in grooves and connection holes, and the individual process steps of forming a copper seed layer by sputtering, filling copper into the grooves and connection holes by electrolytic plating, growing copper crystal by annealing, removing excessive copper by chemical mechanical polishing (referred to as CMP hereinafter), removing an excessive barrier layer by CMP, and forming an anti-oxidative layer by chemical vapor deposition (referred to as CVD hereinafter) on a surface of copper filled in the grooves are carried out. All of these process steps have been carried out using independent apparatuses such as an electrolytic plating apparatus, a CMP apparatus and a CVD apparatus.

However, in the forming process of the copper wiring, a plurality of process steps such as a step for forming the copper seed layer, a step for copper plating, a step for annealing and two CMP steps were carried out respectively in the corresponded apparatuses. Accordingly, there has been a problem of a long TAT (turn-around time).

In addition, polishing of the copper and the barrier layer by CMP requires separate slurries and separate pads for the copper and the barrier layer, respectively, which makes the process complicated. This raises one reason for the cost higher than that of the conventional aluminum wiring. In particular for CMP, a large cost for consumable materials such as polishing slurry and polishing pad has been a serious problem.

SUMMARY OF THE INVENTION

The present invention is to provide a semiconductor manufacturing apparatus and a method for manufacturing semiconductor devices which are aimed at solving the foregoing problems.

A first semiconductor manufacturing apparatus according to the present invention has installed therein an electrolytic plating chamber with which an electrolytic plating apparatus responsible for electrolytic plating of a substrate is constructed, an electrolytic polishing chamber with which an electrolytic polishing apparatus responsible for electrolytic polishing of a substrate is constructed, and a conveying chamber having installed therein a conveying instrument responsible for loading/unloading of the substrate to or from the electrolytic plating chamber, and to or from the electrolytic polishing chamber, and being connected respectively to the electrolytic plating chamber and the electrolytic polishing chamber.

The above-mentioned first semiconductor manufacturing apparatus has the electrolytic plating chamber with which the electrolytic plating apparatus is constructed and the electrolytic polishing chamber with which the electrolytic polishing apparatus is constructed; and the individual chambers are connected to the conveying chamber provided with the conveying instrument, so that both of electrolytic plating and electrolytic polishing are successively accomplished within a single apparatus. Moreover, these processes are successively accomplished without exposing the substrate to the air but only by conveying the substrate via the conveying chamber, so that TAT will considerably be shortened. The apparatus is also advantageous in that the costs for the consumable materials are not so expensive as in CMP, since the removal step relies upon electrolytic polishing, not upon CMP.

A second semiconductor manufacturing apparatus according to the present invention has installed therein an electrolytic plating chamber with which an electrolytic plating apparatus responsible for electrolytic plating of a substrate is constructed, an electrolytic polishing chamber with which an electrolytic polishing apparatus responsible for electrolytic polishing of a substrate is constructed, an electroless plating chamber with which an electroless plating apparatus responsible for electroless plating of the substrate is constructed, an annealing chamber with which an annealing apparatus responsible for annealing of the substrate is constructed, and a conveying chamber having installed therein a conveying instrument responsible for loading/unloading of the substrate to or from the electrolytic plating chamber, to or from the electrolytic polishing chamber, to or from the electroless plating chamber, and to or from the annealing chamber, and being connected respectively to the electrolytic plating chamber, the electrolytic polishing chamber, the electroless plating chamber and the annealing chamber.

The above-mentioned second semiconductor manufacturing apparatus has an electrolytic plating chamber with which an electrolytic plating apparatus is constructed with which the electrolytic polishing apparatus is constructed, the electrolytic polishing chamber, the electroless plating chamber and the annealing chamber; and the individual chambers are connected to the conveying chamber provided with the conveying instrument, so that all of electrolytic plating, electrolytic polishing, electroless plating and annealing are successively accomplished within a single apparatus. Moreover, these processes are successively accomplished without exposing the substrate to the air but only by conveying the substrate to or from the individual chambers via the conveying chamber, so that TAT will considerably be shortened. The apparatus is also advantageous in that the costs for the consumable materials are not so expensive as in CMP, since the removal step relies upon electrolytic polishing, not upon CMP.

A first method for manufacturing a semiconductor device according to the present invention is comprised of a step of forming an electrolytic plated film by electrolytic plating process on a substrate; and a step of successively removing at least a part of the electrolytic plated film formed on the substrate by electrolytic polishing process without exposing the substrate to an oxidative atmosphere.

The above-mentioned first method for manufacturing a semiconductor device can successively accomplish electrolytic plating and electrolytic polishing, so that TAT will considerably be shortened as compared with that in the conventional manufacturing method in which the individual processes were accomplished by wandering from apparatus to apparatus, each of which is only responsible for a single processing.

A second method for manufacturing a semiconductor device according to the present invention is comprised of a step of forming an electrolytic plated film by electrolytic plating process on a substrate; a step of successively removing at least a part of the electrolytic plated film formed on the substrate by electrolytic polishing process without exposing the substrate after the electrolytic plating to an oxidative atmosphere; a step of annealing the substrate after the electrolytic polishing without exposing the substrate to the oxidative atmosphere; and a step of forming an electroless plated film by electroless plating process on the substrate without exposing the substrate to the oxidative atmosphere.

The above-mentioned second method for manufacturing a semiconductor device can successively accomplish electrolytic plating, electrolytic polishing and electroless plating without exposing the substrate to an oxidative atmosphere, and can also accomplish annealing as being continued from the electrolytic plating, electrolytic polishing or electroless plating, so that TAT will considerably be shortened as compared with that in the conventional manufacturing method in which the individual processes were accomplished by wandering from apparatus to apparatus, each of which is only responsible for a single processing.

DETAILED DESCRIPTION OF THE INVENTION

An embodiment of a first semiconductor manufacturing apparatus according to the present invention will be explained referring to schematic structural views shown in FIGS. 1 to 3.

Figure 1:
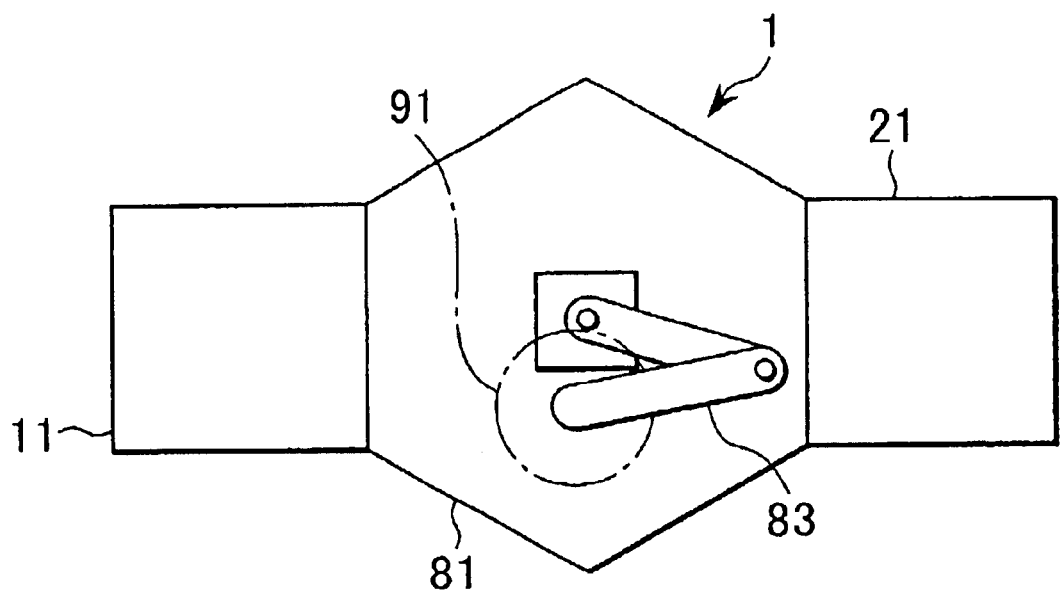
FIG. 1 is a schematic structural view of one embodiment of a first semiconductor manufacturing apparatus according to the present invention.

As shown in FIG. 1, a first semiconductor manufacturing apparatus 1 comprises an electrolytic plating chamber 11 with which an electrolytic plating apparatus responsible for electrolytic plating of a substrate is constructed, an electrolytic polishing chamber 21 with which an electrolytic polishing apparatus responsible for electrolytic polishing of a substrate is constructed, and a conveying chamber 81 connected respectively to the electrolytic plating chamber 11 and the electrolytic polishing chamber 21.

Figure 2:
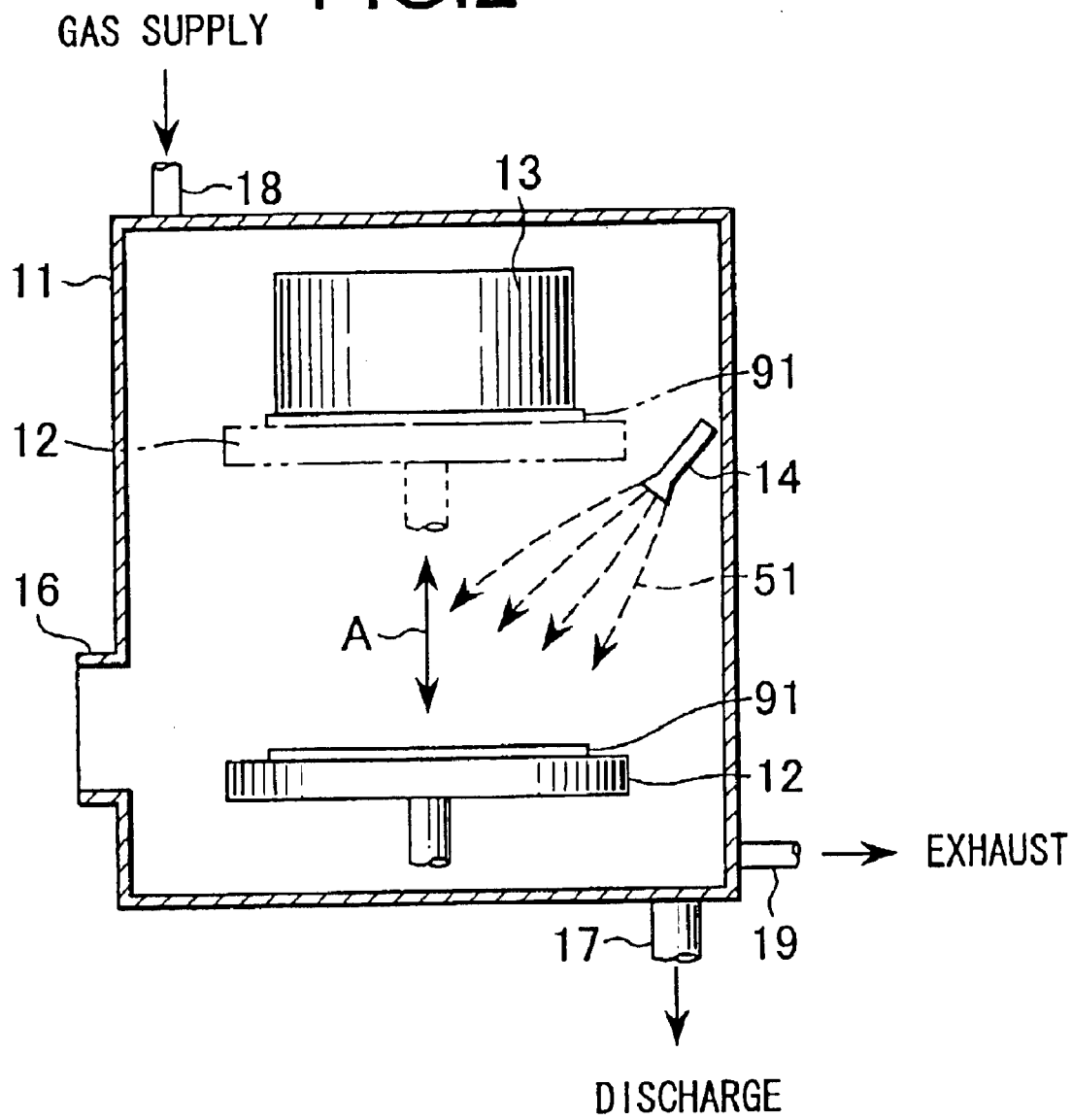
FIG. 2 is a schematic structural view of an electrolytic plating chamber.

As shown in FIG. 2, the electrolytic plating chamber 11 has installed therein a holder 12 for holding a substrate 91, which is designed so as to freely ascend or descend along a direction indicated by an arrow A. The electrolytic plating chamber has a cup 13 at a position opposed to the holder 12. The cup 13 is capable of forming a closed space, into which an electrolytic plating solution (not shown) can be filled, together with the substrate 91 held by the holder 12 when the holder 12 is elevated. The elevated status is illustrated with a two-dot chain line. To the cup 13, an electrolytic plating solution supply portion (not shown) for supplying an electrolytic plating solution is connected.

The chamber is also provided with a nozzle 14 for supplying a process liquid to the surface of the substrate 91 held on the holder 12. The nozzle 14 may be, for example, a spray nozzle, a shower nozzle, or those having other constitutions. The nozzle 14 is designed to supply a cleaning liquid 51 (illustrated with a broken line), for example, as the process liquid onto the substrate 91.

On a side portion of the electrolytic plating chamber 11, an entrance 16 through which the substrate 91 is loaded or unloaded is provided. The entrance 16 is provided with a gate valve (not shown), for example, and is connected to the conveying chamber 81. At the bottom portion of the electrolytic plating chamber 11, a drain 17 through which an exhausted electrolytic plating solution and used cleaning liquid are discharged is provided. The electrolytic plating chamber 11 has also connected thereto a non-oxidative gas supply portion 18 for keeping the chamber atmosphere non-oxidative, and has further connected thereto an exhaust portion 19 through which the non-oxidative gas is discharged. It should now be noted that although the holder 12 was designed to freely ascend or descend in the foregoing constitution, the cup 13 may be allowed to freely ascend or descend instead while keeping the holder 12 in a fixed position.

Figure 3:
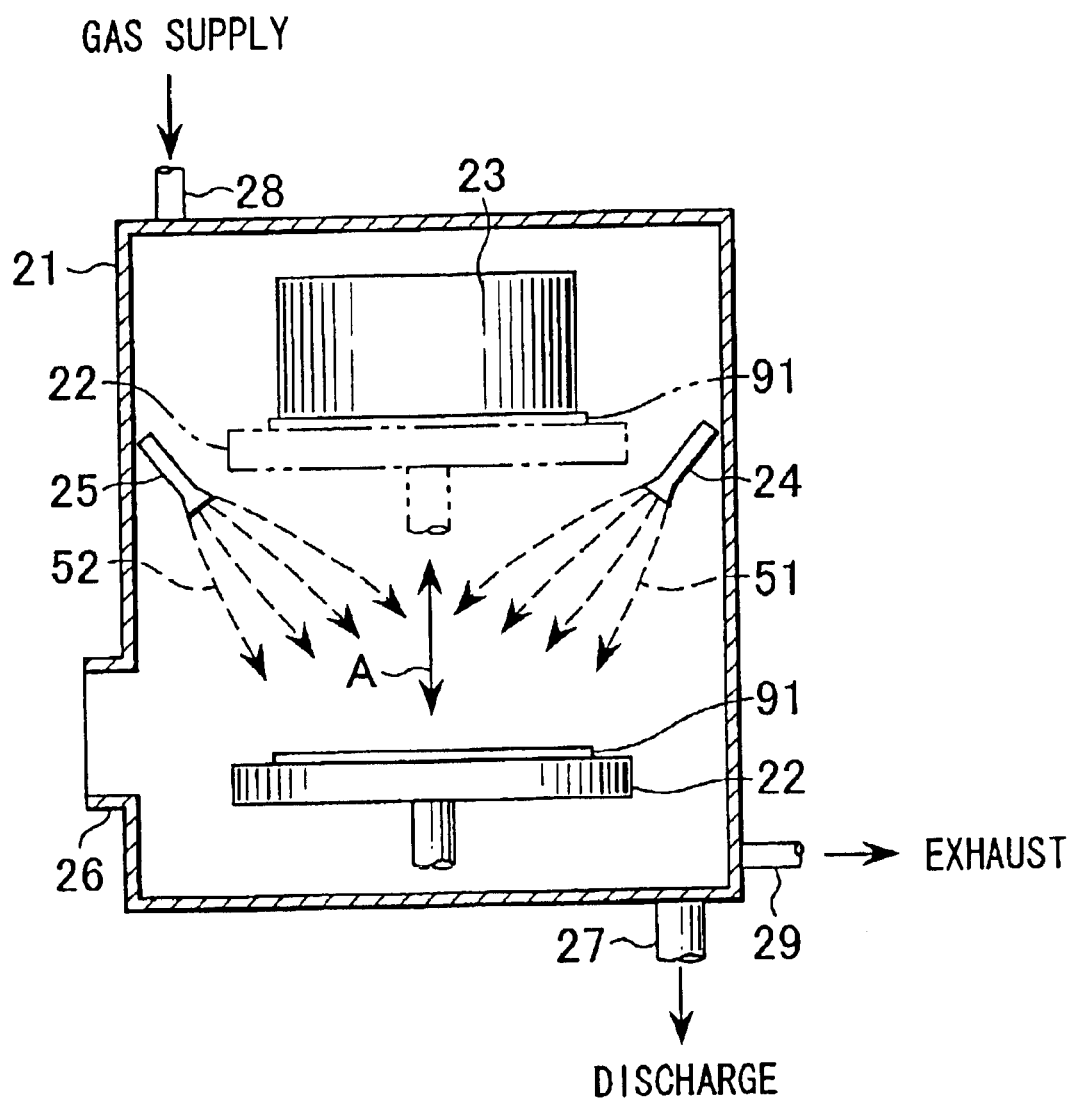
FIG. 3 is a schematic structural view of an electrolytic polishing chamber.

As shown in FIG. 3, the electrolytic polishing chamber 21 has installed therein a holder 22 for holding a substrate 91, which is designed so as to freely ascend or descend along a direction indicated by an arrow A. The electrolytic polishing chamber 21 has a cup 23 at a position opposed to the holder 22. The cup 23 is capable of forming a closed space, into which an electrolytic polishing solution (not shown) can be filled, together with the substrate 91 held by the holder 22 when the holder 22 is elevated. Such elevated status is illustrated with a two-dot chain line. To the cup 23, an electrolytic polishing solution supply portion (not shown) for supplying electrolytic polishing solution is connected.

The chamber is also provided with first and second nozzles 24, 25 for supplying process liquids to the surface of the substrate 91 held on the holder 22. The nozzles 24, 25 may be, for example, spray nozzles, shower nozzles, or those having other constitutions. The first nozzle 24 is designed to supply, for example, the cleaning liquid 51 as the process liquid onto the substrate 91. The second nozzle 25 is typically designed to supply, for example, an etching solution 52 as the process liquid onto the substrate 91.

On a side portion of the electrolytic polishing chamber 21, an entrance 26 through which the substrate 91 is loaded or unloaded is provided. The entrance 26 is provided with a gate valve (not shown), for example, and is connected to the conveying chamber 81. At a bottom portion of the electrolytic polishing chamber 21, a drain 27 through which an exhausted electrolytic polishing solution, an etching solution and a used cleaning liquid are discharged is provided. The electrolytic polishing chamber 21 has also connected thereto a non-oxidative gas supply portion 28 for keeping the chamber atmosphere non-oxidative, and has further connected thereto an exhaust portion 29 through which the non-oxidative gas is discharged. It should now be noted that although the holder 22 was designed to freely ascend or descend in the foregoing constitution, the cup 23 may be allowed to freely ascend or descend instead while keeping the holder 22 in a fixed position.

As shown in FIG. 1, the conveying chamber 81 is provided with a conveying instrument 83 responsible for loading/unloading of the substrate to or from the electrolytic plating chamber 11 and to or from the electrolytic polishing chamber 21, and is connected via the gate valve to the electrolytic plating chamber 11 and the electrolytic polishing chamber 21 respectively at the entrance for loading/unloading the substrate 91.

The first semiconductor manufacturing apparatus has the electrolytic plating chamber 11 with which an electrolytic plating apparatus is constructed and the electrolytic polishing chamber 21 with which an electrolytic polishing apparatus is constructed, and these chambers are connected to the conveying chamber 81 provided with the conveying instrument 83, so that electrolytic plating and electrolytic polishing can successively be accomplished within a single apparatus having a plurality of functions. Moreover, the substrate can successively be transferred simply through the conveying chamber 81 only, without exposing the substrate to the air, so that TAT can considerably be shortened. The apparatus is also advantageous in that the costs for the consumable materials are not so expensive as in CMP, since the removal step relies upon electrolytic polishing, not upon CMP.

An embodiment of a second semiconductor manufacturing apparatus according to the present invention will be explained referring to the schematic drawing in FIG. 4, the foregoing FIGS. 2 and 3, and schematic structural views in FIGS. 5 and 6. It should be noted that parts similar to those previously explained referring to FIGS. 1 to 3 will have the same reference numerals.

Figure 4:
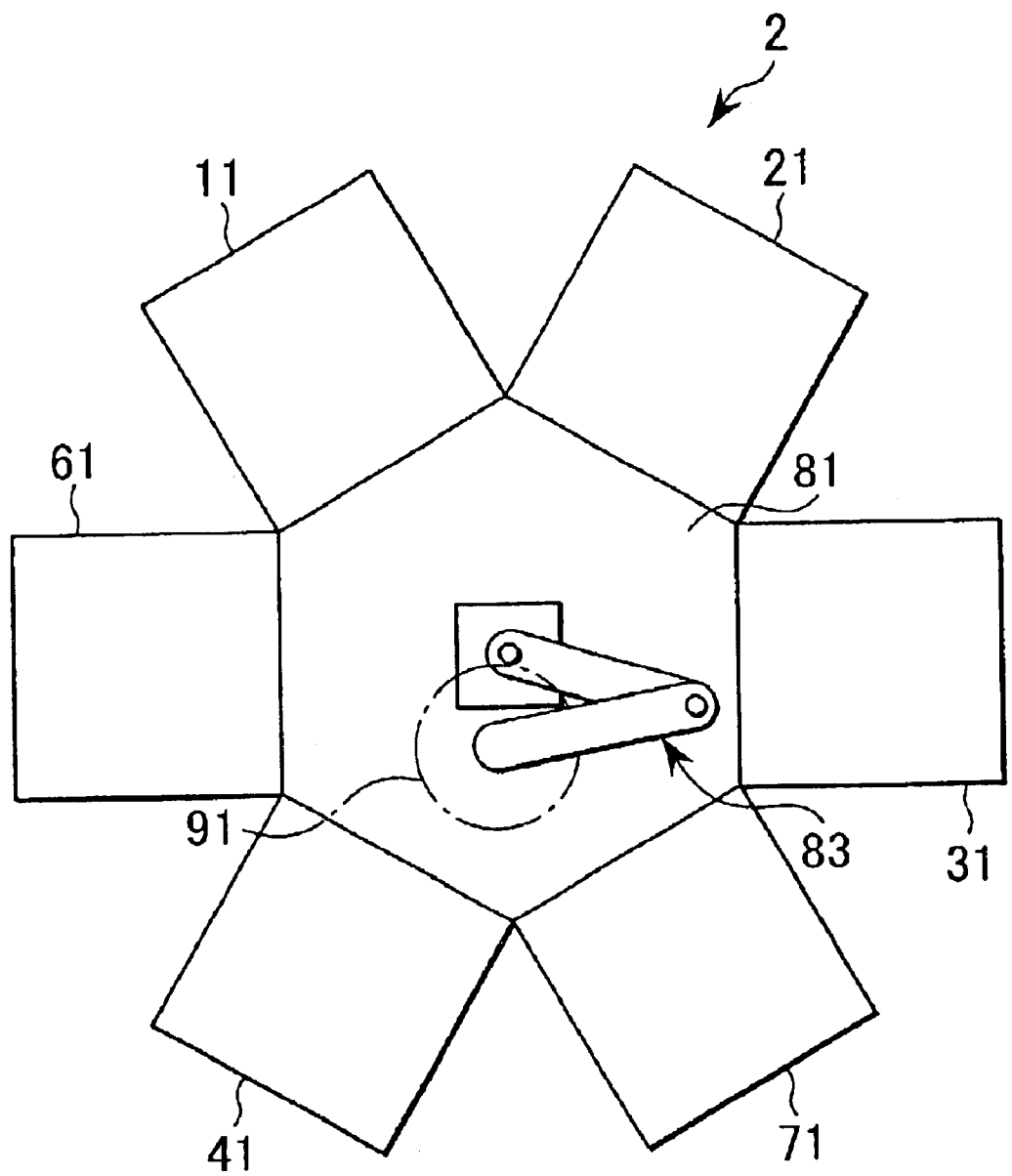
FIG. 4 is a schematic structural view of one embodiment of a second semiconductor manufacturing apparatus according to the present invention.

As shown in FIG. 4, a second semiconductor manufacturing apparatus 2 has an electrolytic plating chamber 11 with which an electrolytic plating apparatus responsible for electrolytic plating of the substrate is constructed, an electrolytic polishing chamber 21 with which an electrolytic polishing apparatus responsible for electrolytic polishing of the substrate is constructed, an electroless plating chamber 31 with which an electroless plating apparatus responsible for electroless plating of the substrate is constructed, an annealing chamber 41 with which an annealing apparatus responsible for annealing of the substrate is constructed, and a conveying chamber 81 to which he electrolytic plating chamber 11, the electrolytic polishing chamber 21, the electroless plating chamber 31 and the annealing chamber 41 are connected. The conveying chamber 81 has also connected thereto an electrolytic plating chamber 61 for reinforcing and/or forming a plating seed layer, and a liquid treatment chamber 71 for supplying a process liquid to the substrate.

The electrolytic plating chamber 11 has a structure similar to that previously explained referring to FIG. 2. That is, as shown in FIG. 2, the electrolytic plating chamber 11 has installed therein a holder 12 for holding a substrate 91, which is designed so as to freely ascend or descend along a direction indicated by an arrow A. The electrolytic plating chamber has a cup 13 at a position opposed to the holder 12. The cup 13 is capable of forming a closed space, into which an electrolytic plating solution (not shown) can be filled, together with the substrate 91 held by the holder 12 when the holder 12 is elevated. Such elevated status is illustrated with a two-dot chain line. To the cup 13, an electrolytic plating solution supply portion (not shown) for supplying electrolytic plating solution is connected. The cup 13 has further connected thereto a power source for supplying electric power necessary for electrolytic plating, although not shown.

The chamber is also provided with a nozzle 14 for supplying a process liquid to a surface of the substrate 91 held on the holder 12. The nozzle 14 may be, for example, a spray nozzle, a shower nozzle, or those having other constitutions. The nozzle 14 is designed to supply a cleaning liquid 51 (illustrated with a broken line), for example, as the process liquid onto the substrate 91.

On a side portion of the electrolytic plating chamber 11, an entrance 16 through which the substrate 91 is loaded or unloaded is provided. The entrance 16 is provided with a gate valve (not shown), for example, and is connected to the conveying chamber 81. At a bottom portion of the electrolytic plating chamber 11, a drain 17 through which an exhausted electrolytic plating solution and used cleaning liquid are discharged is provided. The electrolytic plating chamber 11 has also connected thereto a non-oxidative gas supply portion 18 for keeping the chamber atmosphere non-oxidative, and further connected with an exhaust portion 19 through which the non-oxidative gas is discharged. It should now be noted that although the holder 12 was designed to freely ascend or descend in the foregoing constitution, the cup 13 may be allowed to freely ascend or descend instead while keeping the holder 12 in a fixed position.

The electrolytic polishing chamber 21 has a structure similar to that previously explained referring to FIG. 3. That is, as shown in FIG. 3, the electrolytic polishing chamber 21 has installed therein a holder 22 for holding a substrate 91, which is designed so as to freely ascend or descend along a direction indicated by an arrow A. The electrolytic polishing chamber 21 has a cup 23 at a position opposed to the holder 22. The cup 23 is capable of forming a closed space, into which an electrolytic polishing solution (not shown) can be filled, together with the substrate 91 held by the holder 22 when the holder 22 is elevated. Such elevated status is illustrated with a two-dot chain line. To the cup 23, an electrolytic polishing solution supply portion (not shown) for supplying electrolytic polishing solution is connected. The cup 23 has further connected thereto a power source for supplying electric power necessary for electrolytic polishing, although not shown.

The chamber is also provided with first and second nozzles 24, 25 for supplying process liquids to a surface of the substrate 91 held on the holder 22. The nozzles 24, 25 may be, for example, spray nozzles, shower nozzles, or those having other constitutions. The first nozzle 24 is designed to supply, for example, a cleaning liquid 51 as the process liquid onto the substrate 91. The second nozzle 25 is designed to supply, for example, an etching solution 52 as the process liquid onto the substrate 91.

On a side portion of the electrolytic polishing chamber 21, an entrance 26 through which the substrate 91 is loaded or unloaded is provided. The entrance 26 is provided with a gate valve (not shown), for example, and is connected to the conveying chamber 81. At a bottom portion of the electrolytic polishing chamber 21, a drain 27 through which an exhausted electrolytic plating solution, an etching solution and a used cleaning liquid are discharged is provided. The electrolytic polishing chamber 21 has also connected thereto a non-oxidative gas supply portion 28 for keeping the chamber atmosphere non-oxidative, and further connected with an exhaust portion 29 through which the non-oxidative gas is discharged. It should now be noted that although the holder 22 was designed to freely ascend or descend in the foregoing constitution, the cup 23 may be allowed to freely ascend or descend instead while keeping the holder 22 in a fixed position.

Figure 5:
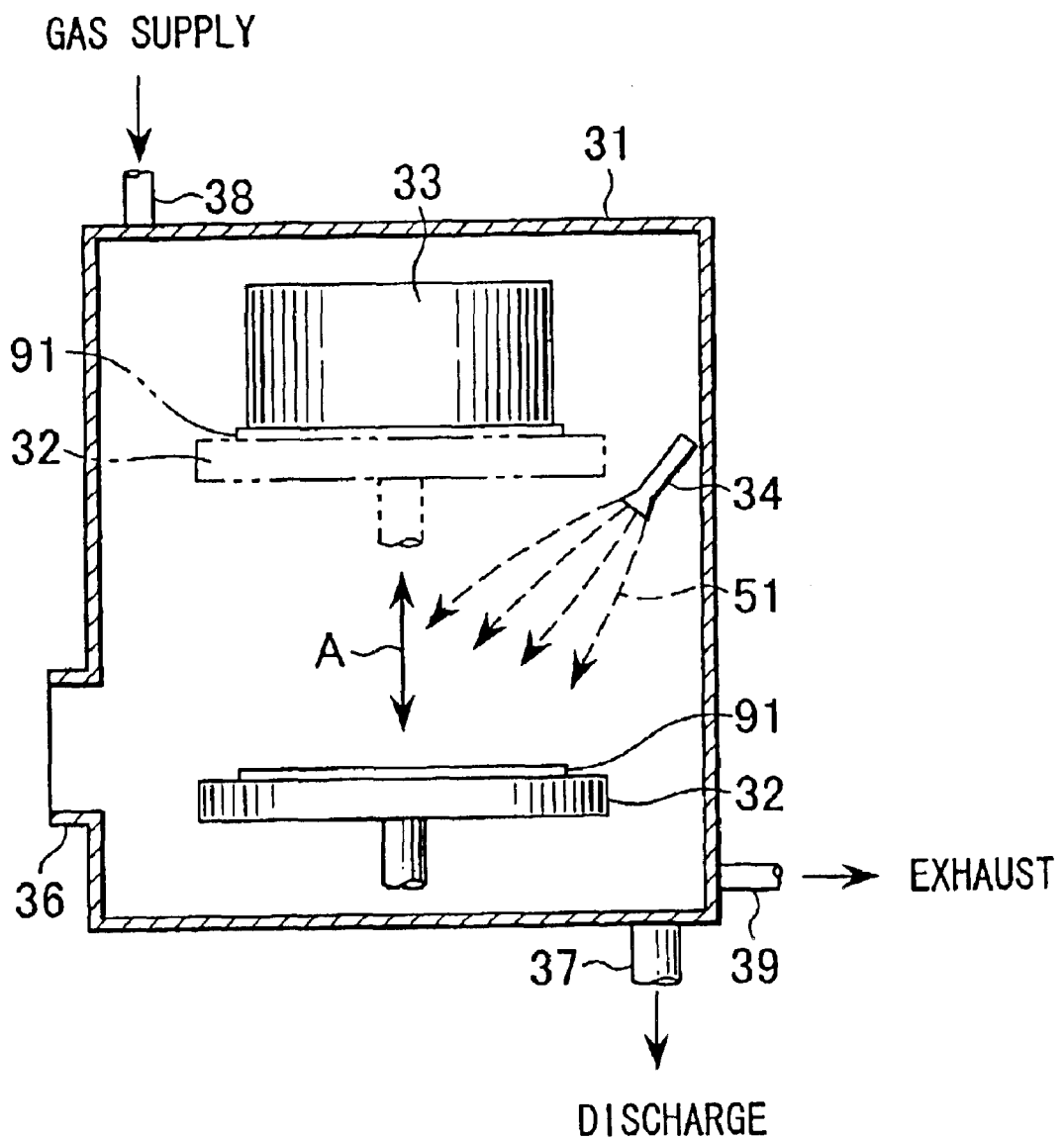
FIG. 5 is a schematic structural view of an electroless plating chamber.

As shown in FIG. 5, the electroless plating chamber 31 has installed therein a holder 32 for holding a substrate 91, which is designed so as to freely ascend or descend along a direction indicated by an arrow. The electroless plating chamber 31 has a cup 33 at a position opposed to the holder 32. The cup 33 is capable of forming a closed space, into which an electroless plating solution (not shown) can be filled, together with the substrate 91 held by the holder 32 when the holder 32 is elevated. Such elevated status is illustrated with a two-dot chain line. To the cup 33, an electroless plating solution supply portion (not shown) for supplying electroless plating solution is connected.

The chamber is also provided with a nozzle 34 for supplying a process liquid to a surface of the substrate 91 held on the holder 32. The nozzle 34 may be, for example, a spray nozzle, a shower nozzle, or those having other constitutions. The nozzle 34 is designed to supply a cleaning liquid 51 (illustrated with a broken line), for example, as the process liquid onto the substrate 91.

On a side portion of the electroless plating chamber 31, an entrance 36 through which the substrate 91 is loaded or unloaded is provided. The entrance 36 is provided typically with a gate valve (not shown), for example, and is connected to the conveying chamber 81. At the bottom portion of the electroless plating chamber 31, a drain 37 through which an exhausted electroless plating solution and a used cleaning liquid are discharged is provided. The electroless plating chamber 31 has also connected thereto a non-oxidative gas supply portion 38 for keeping the chamber atmosphere non-oxidative, and has further connected thereto an exhaust portion 39 through which the non-oxidative gas is discharged. It should now be noted that although the holder 32 was designed to freely ascend or descend in the foregoing constitution, the cup 33 may be allowed to freely ascend or descend instead while keeping the holder 32 in a fixed position.

Figure 6:
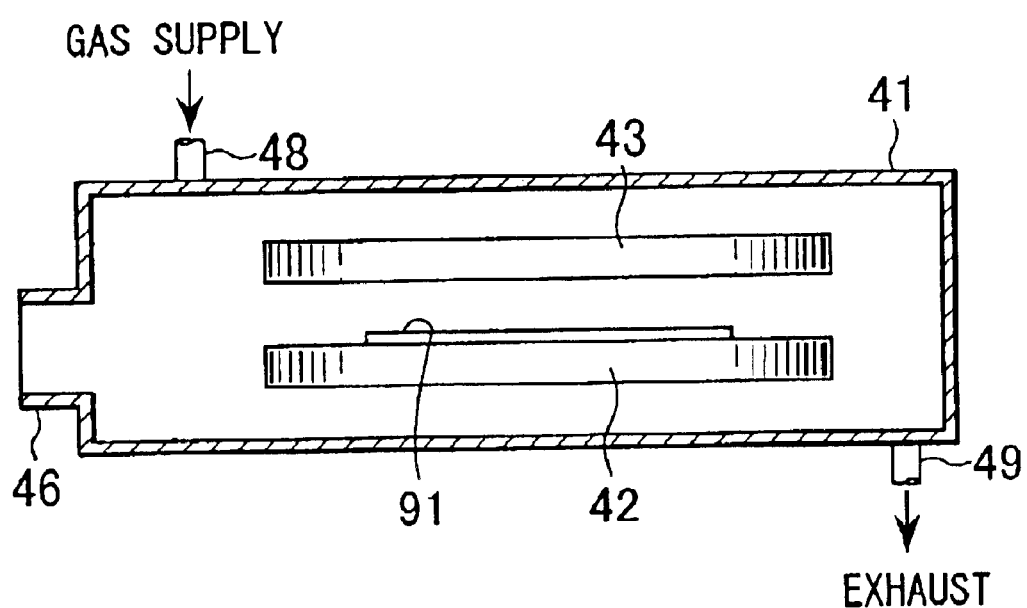
FIG. 6 is a schematic structural view of an annealing chamber.

As shown in FIG. 6, the annealing chamber 41 with which an annealing apparatus is constructed has installed therein a holder 42 for holding a substrate 91. The annealing chamber 41 has a heat source 43 for heating the substrate 91 at a position opposed to the holder 42. Besides the heat source 43, it is also allowable to provide another heat source within the holder 42. For a case where the annealing apparatus is provided as a furnace apparatus, the heat source 43 is constructed with a heating wire, for example. For a case where the annealing apparatus is provided as an RTA (rapid thermal annealing) apparatus, the heat source 43 is constructed with a heating lamp, for example. The annealing chamber 41 has also connected thereto a gas supply portion 48 and a gas exhaust portion 49, both of which contribute to formation of an annealing atmosphere. On a side portion of the annealing chamber 41, an entrance 46 through which the substrate 91 is loaded or unloaded is provided. The entrance 46 is provided typically with a gate valve (not shown), for example, and is connected to the conveying chamber 81.

The electrolytic plating chamber 61 for reinforcing and/or forming the plating seed layer can be constructed similarly to that previously described referring to FIG. 2.

The liquid treatment chamber 71 for supplying a process liquid to the substrate has installed therein a holder for holding the substrate, and one or more nozzle for supplying process liquid to the substrate held on the holder. Shape of the nozzle may be any of a tubular nozzle, a spray nozzle and a shower nozzle. The nozzle may be positioned straight upward over the center of the substrate held on the holder, or may be obliquely upward over the substrate, so far as the nozzle can uniformly supply the process liquid over the entire surface of the substrate. At a bottom portion of the liquid treatment chamber 71, a drain (not shown) through which the process liquid is discharged is provided. The process liquid may be a cleaning liquid for cleaning the substrate, which is typified by pure water. It may also be designed to supply an etching solution. On a side portion of the liquid treatment chamber 71, an entrance through which the substrate 91 is loaded or unloaded is provided. The entrance is provided with a gate valve (not shown), for example, and is connected to the conveying chamber 81.

As previously shown in FIG. 4, the conveying chamber 81 has installed therein a conveying instrument 83 which is responsible for loading/unloading of the substrate to or from the electrolytic plating chamber 11, loading/unloading of the substrate to or from the electrolytic polishing chamber 21, loading/unloading of the substrate to or from the electroless plating chamber 31, loading/unloading of the substrate to or from the annealing chamber 41, loading/unloading of the substrate to or from the electrolytic plating chamber 61, and loading/unloading of the substrate to or from the liquid treatment chamber 71, and is connected respectively to the electrolytic plating chamber 11, the electrolytic polishing chamber 21, the electroless plating chamber 31, the annealing chamber 41, the electrolytic plating chamber 61 and the liquid treatment chamber 71 via the gate valve through which the substrate 91 is loaded or unloaded.

The above-mentioned second semiconductor manufacturing apparatus 2 has the electrolytic plating chamber 11 with which an electrolytic plating apparatus is constructed, the electrolytic polishing chamber 21 with which an electrolytic polishing apparatus is constructed, the electroless plating chamber 31 with which an electroless plating apparatus is constructed, and the annealing chamber 41 with which an annealing apparatus is constructed; and all of the chambers are connected to the conveying chamber 81 having installed therein the conveying instrument 83, so that electrolytic plating, electrolytic polishing, electroless plating and annealing can successively be accomplished within a single manufacturing apparatus having a plurality of functions. Moreover, the substrate can successively be transferred to or from the individual chambers simply through the conveying chamber 81 only, without exposing the substrate to the air, so that TAT can considerably be shortened. The apparatus is also advantageous in that the costs for the consumable materials are not so expensive as in CMP, since the removal step relies upon electrolytic polishing, not upon CMP.

The conveying chamber 81 of the individual semiconductor manufacturing apparatus described in the above may have connected thereto, via gate valves, substrate stock chambers (not shown) separately housing pre-processing substrates and post-processing substrates.

The individual holders installed in the electrolytic plating chambers 11, 61, electrolytic polishing chamber 21, electroless plating chamber 31 and liquid treatment chamber 71 may be constructed so as to rotate at high speed to thereby effect spin drying of the substrate 91. That is, the holder may have a structure similar to that of a commonly known single wafer spin drier.

Next paragraphs will describe a case where the first semiconductor manufacturing apparatus previously explained referring to FIGS. 1 to 3 is used, as an exemplary embodiment of a first method for manufacturing a semiconductor device.

First, the substrate 91 is transferred using the conveying instrument 83 from the conveying chamber 81 onto the holder 12 in the electrolytic plating chamber 11. The chamber at this time is preferably conditioned so as to have a non-oxidative atmosphere.

The holder 12 in the electrolytic chamber 11 is then elevated so as to form a closed space in the cup 13. The closed space is formed with the cup 13 and the substrate 91 held on the holder 12, and the substrate is then subjected to electrolytic plating using an electrolytic plating solution (not shown) filled in the closed space. After completion of the electrolytic plating, the electrolytic solution filled in the cup 13 is discharged, and the holder is descended back to the initial position. A cleaning liquid is then supplied form the nozzle 14 onto the substrate 91 to thereby effect substrate cleaning. For a case where the holder 12 has a rotatable constitution, it is also allowable to rotate the holder 12 to thereby effect spin drying.

Next, the substrate 91 on the holder 12 is transferred using the conveying instrument 83 to the conveying chamber 81, and then transferred and placed on the holder 22 in the electrolytic polishing chamber 21. In this way, the substrate 91 is transferred to the electrolytic polishing chamber 21 without being exposed to an oxidative atmosphere since the substrate 91 is transferred in a closed space from the electrolytic plating chamber 11 through the conveying chamber 81 to the electrolytic polishing chamber 21. The chambers at this time are preferably conditioned to have a non-oxidative atmosphere.

The holder 22 in the electrolytic chamber 21 is then elevated so as to form in the cup 23 a closed space surrounded by the substrate 91 held on the holder 22 and the cup 23, in which space an electrolytic polishing solution (not shown) is filled to thereby effect electrolytic polishing of the substrate. The amount of electrolytic polishing is properly selected by purposes. After completion of the electrolytic polishing, the electrolytic plating solution in the cup 23 is discharged, and the holder 22 is ascended back to the initial position. A cleaning liquid is then supplied from the first nozzle 24 to the substrate 91 to thereby rinse the substrate. For a case where etching is required, an etching solution is supplied from the second nozzle 25 to the substrate 91 to carry out etching of the substrate. A cleaning liquid is then supplied again from the first nozzle 24 to the substrate 91 to thereby rinse the substrate. For a case where the holder 22 has a rotatable constitution, it is also allowable to rotate the holder 22 to carry out spin drying.

The above-mentioned first method for manufacturing a semiconductor device can successively accomplish electrolytic plating and electrolytic polishing, so that TAT will considerably be shortened as compared with that in the conventional manufacturing method in which the individual processes were accomplished by wandering from apparatus to apparatus, each of which is only responsible for a single processing.

Next paragraphs will describe a case where the second semiconductor manufacturing apparatus previously explained referring to FIG. 4 is used, as an exemplary embodiment of a second method for manufacturing a semiconductor device referring to process drawings of FIGS. 7A to 7F. Note that FIGS. 7A to 7F represent the individual processes. See FIGS. 2 to 6 for the apparatus responsible for the processes.

In this manufacturing method, the processes are successively carried out in the second semiconductor manufacturing apparatus, which is a so-called cluster tool, as previously explained referring to FIG. 4.

Figure 7A:
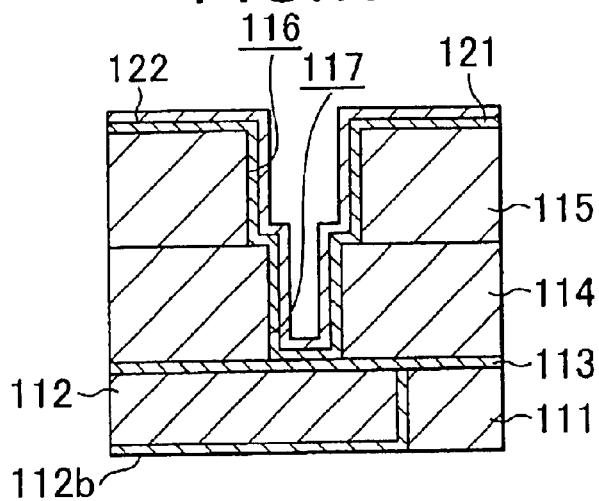
FIGS. 7A to 7F are sectional views showing one embodiment of a second method for manufacturing a semiconductor device according to the present invention.

As shown in FIG. 7A, the substrate (for example, a semiconductor substrate) 91 has formed thereon a first insulating film 111 in which a first wiring 112 having a groove wiring structure is formed as, being interposed by a barrier layer 112b. On the first insulating film 111, a diffusion preventing layer 113 is formed so as to cover the first wiring 112, and further thereon a second insulating film 114 is formed. The diffusion preventing layer 113 may have a function as an etching stopper when a connection hole is formed. On the second insulating film 114, a third insulating film 115 is formed. The third insulating film 115 has formed therein a concave portion 116 (referred to as a groove 116, hereinafter), and a connection hole 117 which reaches the first wiring 112 from the bottom of the groove 116 so as to penetrate the second insulating film 114.

On an inner surface of the wiring groove 116 and the connection hole 117, a barrier layer 121 is formed. The barrier layer 121 is made of, for example, tungsten nitride. On a surface of the barrier layer 121, a copper seed layer 122 is further formed by a film forming technique such as sputtering. Next in the electrolytic plating chamber 61, seed layer reinforcing electrolytic plating for reinforcing the seed layer is carried out in order to supplement an insufficient thickness of the copper seed layer on a side wall of the groove and a side wall of the connection hole with a high aspect ratio. It is preferable herein to condition the chamber so as to have a non-oxidative inner atmosphere. The attached drawing shows the copper seed layer 122 already reinforced by the electrolytic plating. Then the substrate is cleaned in the electrolytic plating chamber 61. The cleaning is performed by, for example, washing with water. The washing with water may also be accomplished in the liquid treatment chamber 71 after the substrate 91 is transferred thereto using the conveying instrument (a conveying robot, for example) 83. All transfer of the substrate 91 thereafter will be responsible for the conveying instrument 83.

Figure 7D:
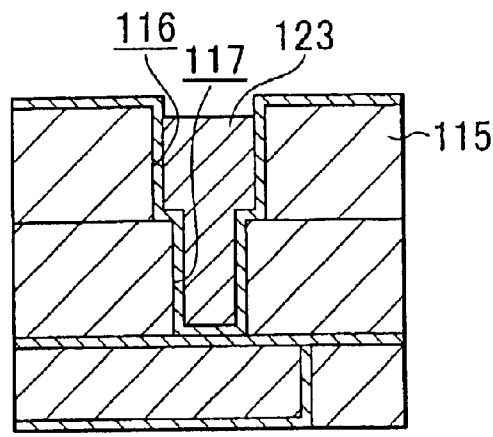
Figure 7B:
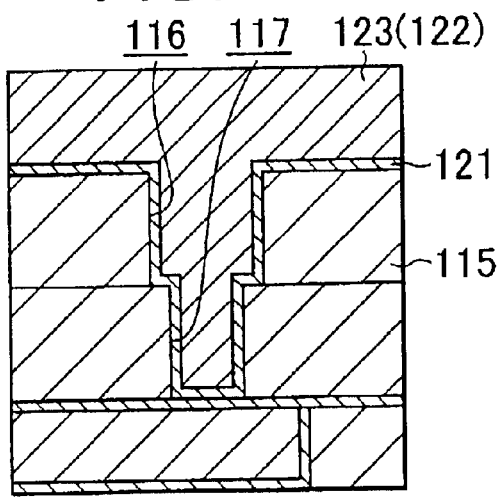

Next as shown in FIG. 7B, the substrate 91 (not shown) is transferred using the conveying instrument 83 onto the holder 12 in the electrolytic plating chamber 11. It is preferable herein to condition the chamber so as to have a non-oxidative inner atmosphere. By proceeding electrolytic copper plating in the electrolytic plating chamber 11, the groove 116 and connection hole 117 are filled with a conductive layer 123 made of copper. The conductive layer 123 at this time is also formed over the barrier layer 121 on the third insulating film 115. The drawing illustrates the copper seed layer 122 as being included in the conductive layer 123. In the process sequence of the electrolytic plating, plating conditions are properly selected so as to planarize the surface of the conductive layer 123 after the plating, to thereby form the copper plating layer having a flat surface. The substrate 91 is then cleaned in the electrolytic plating chamber 11. The cleaning is performed by, for example, washing with water.

Figure 7E:
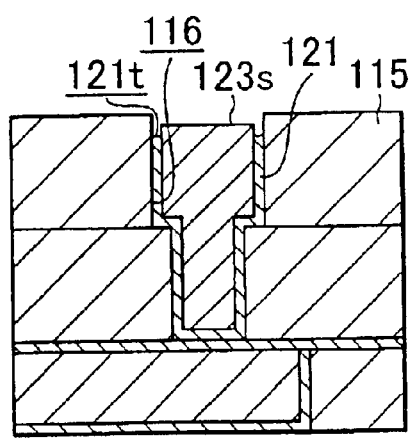
Figure 7C:
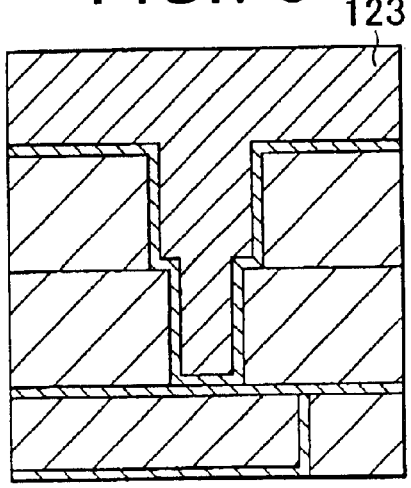

Next as shown in FIG. 7C, the substrate 91 is transferred using the conveying instrument 83 onto the holder 42 in the annealing chamber 41. It is preferable herein to condition the chamber so as to have a non-oxidative inner atmosphere. Thus processed substrate 91 is then annealed in this annealing chamber 41. The annealing promotes growth of copper crystal grains in the conductive layer 123 having fine crystal grains after the electrolytic plating.

Next as shown in FIG. 7D, the substrate 91 is transferred using the conveying instrument 83 onto the holder 22 in the electrolytic polishing chamber 21. It is preferable herein to condition the chamber so as to have a non-oxidative inner atmosphere. Electrolytic polishing is then carried out in the electrolytic polishing chamber 21 so as to remove a portion of the conductive layer 123 which resides on the surface of the insulating film (third insulating film 115), to thereby leave the conductive layer 123 only in the groove 116 and the connection hole 117.

Next as shown in FIG. 7E, in the electrolytic polishing chamber 21, the barrier layer 121 made of tungsten nitride is removed by wet etching using hydrogen peroxide solution. More specifically, an aqueous solution of hydrogen peroxide is sprayed over the surface of the substrate to thereby dissolve and remove an unnecessary portion of the barrier layer 121 made of tungsten nitride which resides over the flat surface. To ensure thorough removal of tungsten nitride from the surface of the third insulating film 115, a certain degree of over-etching will be necessary since the etching of tungsten nitride proceeds in an isotropic manner. As a result, side-etching occurs along the side wall of the groove 116, which makes the upper end 121t of the barrier layer 121 lower than the level of the surface 123s of the conductive layer 123. The substrate 91 is then cleaned in the electrolytic polishing chamber 21. The cleaning is performed by, for example, washing with water.

Figure 7F:
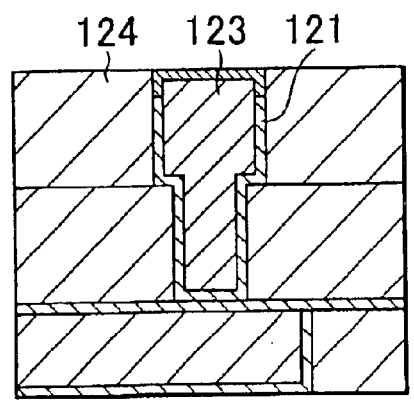

Next as shown in FIG. 7F, the substrate 91 is transferred using the conveying instrument 83 onto the holder 32 in the electroless plating chamber 31. It is preferable herein to condition the chamber so as to have a non-oxidative inner atmosphere. Thus processed substrate 91 is then subjected to electroless plating in this electroless plating chamber to thereby selectively form a cobalt tungsten phosphorus (CoWP) coating 124 on an exposed surface of the conductive layer 123. Selectivity of the film formation is ensured by coating the surface of the conductive layer 123 with palladium by electroless displacement plating of copper before the CoWP electroless plating is carried out. The selectivity is ascribable to the palladium coating since the CoWP film formation proceeds only on the palladium coating as being catalyzed therewith. Once the surface of palladium is coated with CoWP, the succeeding growth of the CoWP plated film proceeds based on auto-catalytic process using CoWP per se as a catalyst while keeping the selectivity. The surface of the conductive layer 123 exposed by the side-etching of the barrier layer 121 made of tungsten nitride is covered with the cobalt tungsten phosphorus coating 124. The substrate 91 is then cleaned in the electroless plating chamber 31. The cleaning is performed by, for example, washing with water.

The non-oxidative atmosphere described in the above can be produced by introducing a rare gas such as argon or nitrogen into the chambers through the individual non-oxidative gas supply portions, and also by exhausting a portion of the non-oxidative gas through the exhaust portions, so as to maintain the non-oxidative gas atmosphere at predetermined pressures in the chambers.

Of the materials described in the above embodiment, the material for the barrier layer 121 is not limited to tungsten nitride at all, and may be replaced with any other materials having a similar function, such as tantalum nitride, or the like. While the above description dealt with the technique by which the cobalt tungsten phosphorus coating 124 is formed on the copper-made conductive layer 123 left in the groove 116, the present invention is also applicable to a technique by which a plug made of copper or a copper alloy is formed in the connection hole, and an upper surface of the plug is coated with the cobalt tungsten phosphorus coating, by way of example.

In the foregoing manufacturing method, the substrate after the cleaning may be spin-dried by rotating the holder at a high speed.

The second method for manufacturing a semiconductor device can successively accomplish electrolytic plating, electrolytic polishing and electroless plating without exposing the substrate 91 to an oxidative atmosphere, and can also accomplish annealing as being continued from the electrolytic plating, electrolytic polishing or electroless plating, so that TAT will considerably be shortened as compared with that in the conventional manufacturing method in which the individual processes were accomplished by wandering from apparatus to apparatus, each of which is only responsible for a single processing.

The above-described method for manufacturing a semiconductor device removes the barrier layer 121 on the surface of the third insulating film 115 so that the upper end of the barrier layer 121 left in the concave portion (groove) 116 falls between the side plane of the conductive layer 123 and the side wall of the groove 116, and thereafter forms the cobalt tungsten phosphorus coating 124 so as to come into contact with the barrier layer 121 at the side portion of the conductive layer 123 and so as to selectively cover the conductive layer 123 at the opening side of the groove 116. Accordingly, the cobalt tungsten phosphorus coating 124 is formed so as to come into contact with the barrier layer 121 at the side portion of the conductive layer 123 and so as to selectively cover the conductive layer 123 at the opening side of the groove 116. Since the cobalt tungsten phosphorus coating 124 is unlikely to provide a predominant diffusion path of copper at the interface with the copper, wiring formed of the conductive layer 123 will be ensured to have an excellent electro-migration resistance (reliability).

The foregoing description dealt with the case in which the barrier layer 121 on the surface of the third insulating film 115 is removed by wet etching using hydrogen peroxide solution. It is a general practice to perform over-etching so as to ensure thorough removal of the barrier layer 121 on the surface of the third insulating film 115. As a result, the upper end of the barrier layer 121 left in the groove 116 will fall between the side plane of the conductive layer 123 and the side wall of the groove 116. The barrier layer 121 formed on the side wall of the groove 116 is removed so that the upper end thereof comes closer to the bottom of the groove 116 than the surface level of the conductive layer 123. Accordingly, the cobalt tungsten phosphorus coating 124 is formed so as to contact with the barrier layer 121 at the side portion of the conductive layer 123.

Since the cobalt tungsten phosphorus coating 124 thus comes into contact with the barrier layer 121 at the side portion of the conductive layer 123, the conductive layer 123 will be brought in a state that it is surrounded by the barrier layer 121 and the cobalt tungsten phosphorus coating 124. Moreover, the contact portion thereof will be located at the side portion of the conductive layer 123, which allows the cobalt tungsten phosphorus coating 124 to come into close contact with the conductive layer 123 at the top surface and the side plane thereof, to thereby make the cobalt tungsten phosphorus coating 124 unlikely to be peeled off. This also enhance close connection between the cobalt tungsten phosphorus coating 124 and the barrier layer 121, so that copper diffusion into the conductive layer can successfully be blocked by the cobalt tungsten phosphorus coating 124 and the barrier layer 121. In addition, the conductive layer 123 can be prevented from being oxidized since oxygen diffusion thereto is also blocked.

Use of the cobalt tungsten phosphorus coating 124 is also advantageous in that achieving an excellent electromigration resistance (reliability) even when copper having a chemically unstable surface is used, since the interface between the copper and the cobalt tungsten phosphorus does not provide a diffusion path for the copper.

The coating over the copper surface likely to be oxidized with the cobalt tungsten phosphorus coating 124 is also advantageous since the film will not increase parasitic capacitance of the whole wiring system.

It is also advantageous that the cobalt tungsten phosphorus coating 124 can function as an anti-oxidative film, which allows direct film formation of a low dielectric-constant insulating film without forming a silicon nitride film, which contributes to a considerable reduction in parasitic resistance of the whole wiring system.

As has been described in the above, the first semiconductor manufacturing apparatus according to the present invention can successively accomplish electrolytic plating and electrolytic polishing in a single apparatus, since the apparatus has an electrolytic plating chamber and an electrolytic polishing chamber, both of which are connected to a conveying chamber having equipped with a conveying instrument. Moreover, the substrate can successively be transferred simply through the conveying chamber only, without exposing the substrate to the air, so that TAT can considerably be shortened. The apparatus is also advantageous in that the costs for the consumable materials are not so expensive as in CMP, since the removal step relies upon electrolytic polishing, not upon CMP.

The second semiconductor manufacturing apparatus according to the present invention can successively accomplish electrolytic plating, electrolytic polishing, electroless plating and annealing in a single apparatus, since the apparatus has an electrolytic plating chamber, an electrolytic polishing chamber, an electroless plating chamber and an annealing chamber, all of which are connected to a conveying chamber having equipped with a conveying instrument. Moreover, the substrate can successively be transferred simply through the conveying chamber only, without exposing the substrate to the air, so that TAT can considerably be shortened. The apparatus is also advantageous in that the costs for the consumable materials are not so expensive as in CMP, since the removal step relies upon electrolytic polishing, not upon CMP.

The first method for manufacturing a semiconductor device according to the present invention can successively accomplish electrolytic plating and electrolytic polishing, so that TAT will considerably be shortened as compared with that in the conventional manufacturing method in which the individual processes were accomplished by wandering from apparatus to apparatus, each of which is only responsible for a single processing.

The second method for manufacturing a semiconductor device according to the present invention can successively accomplish electrolytic plating, electrolytic polishing and electroless plating without exposing the substrate to an oxidative atmosphere, and can also accomplish annealing as being continued from the electrolytic plating, electrolytic polishing or electroless plating, so that TAT will considerably be shortened as compared with that in the conventional manufacturing method in which the individual processes were accomplished by wandering from apparatus to apparatus, each of which is only responsible for a single processing.

What is claimed is:

1. A method for manufacturing a semiconductor device, said method comprising:
    a step of forming an electrolytic plated film by electrolytic plating process on a substrate; and
    a step of successively removing at least a part of the electrolytic plated film formed on the substrate by an electrolytic polishing process without exposing the substrate to an oxidative atmosphere.

2. The method for manufacturing a semiconductor device as claimed in claim 1, said method further comprising a step of annealing the residual electrolytic plated film after such electrolytic polishing.

3. The method for manufacturing a semiconductor device as claimed in claim 1, said method further comprising, after said electrolytic polishing, a step of subjecting the substrate to a chemical liquid treatment without exposing the substrate to an oxidative atmosphere.

4. A method for manufacturing a semiconductor device, said method comprising:
    a step of forming an electrolytic plated film by electrolytic plating process on a substrate;
    a step of successively removing at least a part of the electrolytic plated film formed on the substrate by an electrolytic polishing process without exposing the substrate after the electrolytic plating to an oxidative atmosphere;
    a step of annealing the substrate after the electrolytic polishing without exposing the substrate to the oxidative atmosphere; and
    a step of forming an electroless plated film by an electroless plating process on the annealed substrate without exposing the substrate to the oxidative atmosphere.

5. The method for manufacturing a semiconductor device as claimed in claim 4, said method further comprising, after the electrolytic polishing, a step of subjecting the substrate to a chemical liquid treatment without exposing the substrate to an oxidative atmosphere.

6. A method for manufacturing a semiconductor device, said method comprising the steps of:
    forming an electrolytic plated film by performing an electrolytic plating process on a substrate in an electrolytic plating chamber;
    conveying the substrate from the electrolytic plating chamber to an electrolytic polishing chamber via a closed conveying chamber such that the substrate can be transferred successively through the conveying chamber without exposing the substrate to an oxidative atmosphere; and
    removing at least a part of an electrolytic plated film formed on the substrate using an electrolytic polishing process in the electrolytic polishing chamber without exposing the substrate to an oxidative atmosphere.

7. The method for manufacturing a semiconductor device as claimed in claim 6, wherein said method comprises the further step of annealing the residual electrolytic placed film after such electrolytic polishing.

8. The method for manufacturing a semiconductor device as claimed in claim 6, wherein said method comprises the further step of, after said electrolytic polishing, subjecting the substrate to a chemical liquid treatment without exposing the substrate to an oxidative atmosphere.

9. A method for manufacturing a semiconductor device, said method comprising the steps of:

forming an electrolytic plated film by an electrolytic plating process on a substrate in a first chamber;

conveying the substrate from the first chamber to a second chamber via an intermediate conveying chamber without exposing the substrate to an oxidative atmosphere;

removing at least a part of the electrolytic plated film formed on the substrate by electrolytic polishing process in the second chamber without exposing the substrate to an oxidative atmosphere;

annealing the substrate after the electrolytic polishing without exposing the substrate to an oxidative atmosphere; and forming an electroless plated film using an electroless plating process on the annealed substrate without exposing the substrate to an oxidative atmosphere.

10. The method for manufacturing a semiconductor device as claimed in claim 9, wherein said method further comprises, after the electrolytic polishing, a step of subjecting the substrate to a chemical liquid treatment without exposing the substrate to an oxidative atmosphere.

11. The method of any claims 6–10 wherein the substrate is conveyed within a single apparatus and within which are performed said steps.

* * * * *